(54) METHOD FOR MAKING FLASH MEMORY WITH UV OPAQUE PASSIVATION LAYER

(75) Inventors: Glen Wada, Fremont; R. V. Giridhar, Saratoga; Anthony Ozzello, San Jose, all of CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/330,257

(22) Filed: Jun. 10, 1999

(51) Int. Cl.⁷ ............................................. H01L 21/336
(52) U.S. Cl. ........................ 438/257; 438/266; 438/593
(58) Field of Search .................. 438/257–266, 438/267, 593

(56) References Cited

U.S. PATENT DOCUMENTS 5,010,024 A * 4/1991 Allen et al. .................... 437/24
5,888,836 A * 3/1999 Ghio et al. ...................... 438/4

* cited by examiner

Primary Examiner—Charles Bowers
Assistant Examiner—Jack Chen
(74) Attorney, Agent, or Firm—Mark V. Seeley

(57) ABSTRACT

A method for making a flash memory having a passivation layer that is not transparent to ultraviolet light. The method comprises forming a semiconductor substrate that includes a flash memory cell having a floating gate, then forming a conductive layer on the substrate. Process induced charge that has accumulated on the flash cell floating gate is then neutralized and a passivation layer, which is not transparent to ultraviolet light, is formed on the conductive layer.

4 Claims, 1 Drawing Sheet

METHOD FOR MAKING FLASH MEMORY WITH UV OPAQUE PASSIVATION LAYER

FIELD OF THE INVENTION

The present invention relates to a method for making flash—memories specifically, flash memories that include a passivation layer that is not transparent to ultraviolet light.

BACKGROUND OF THE INVENTION

Current processes for making semiconductor devices use various plasma etch steps to form and pattern conductive layers, e.g., contacts and interconnects. In addition, plasma enhanced chemical vapor deposition ("PECVD") steps may be used to form insulation layers that separate conductive layers. When such process steps are used to make flash memory devices (i.e., erasable programmable read only memories that may be erased electrically), charge may build up on the floating gates of the flash memory cells. That accumulated charge may produce flash memory cells that have uncontrollable threshold voltages, which can yield a defective device.

This problem may be addressed by exposing the device to ultraviolet ("UV") light, which neutralizes any electronic charge that has built up on the flash memory cell floating gate. Because such a step is most effective after all charge inducing process steps have been completed, the UV exposure step is performed near the end of the process, i.e., after the passivation layer, or layers, have been formed. When exposing a device to such a UV erase step, after the passivation layer has already been formed, that layer must be transparent to UV light. That constraint requires UV transparent materials, such as silicon oxynitride, to be used to make the passivation layer, and prevents UV opaque materials from being used to make that layer.

Certain UV opaque materials, e.g., silicon nitride and polyimide, are particularly desirable for making passivation layers. Accordingly, there is a need for a method for making a flash memory that neutralizes charge that may collect on the floating gates of flash memory cells, while permitting use of UV opaque materials to form the passivation layer.

SUMMARY OF THE INVENTION

The present invention covers a method for making a flash memory having a passivation layer that is not transparent to ultraviolet light. The method comprises forming a semiconductor substrate that includes a flash memory cell having a floating gate, then forming a conductive layer on the substrate. Process induced charge that has accumulated on the flash cell floating gate is then neutralized and a passivation layer, which is not transparent to ultraviolet light, is formed on the conductive layer.

DETAILED DESCRIPTION OF THE PRESENT INVENTION

Figure 1:
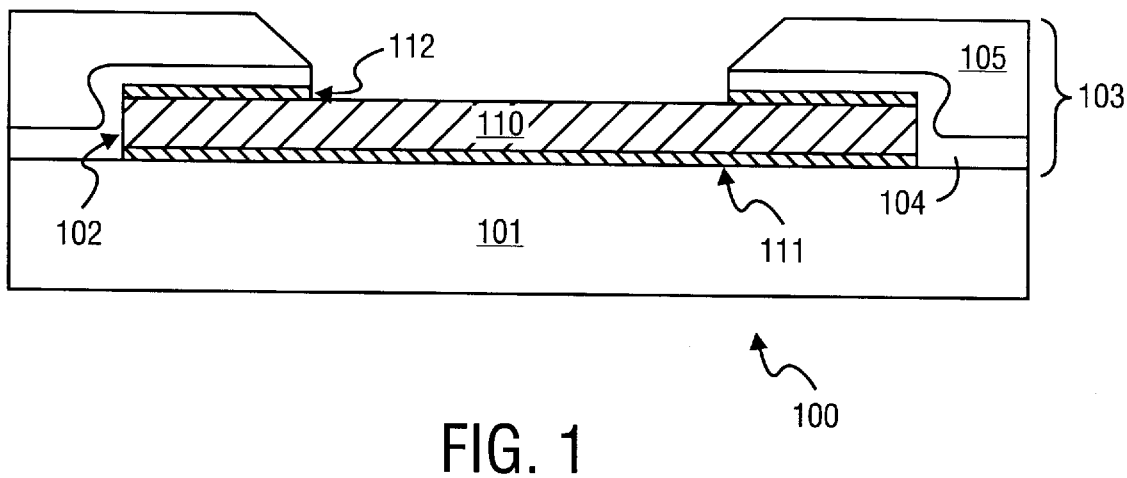
FIG. 1 is an illustration that represents a cross-section of a structure that may be formed when making a flash memory using the method of the present invention.

An improved method for making a flash memory that includes a UV opaque passivation layer, or layers, is described. FIG. 1 illustrates a cross-section that represents structure 100, which may be formed when making a flash memory. Structure 100 includes a semiconductor substrate 101 that includes conventional flash memory features, including flash memory cells (not shown). Each flash cell includes a floating gate, which is capable of storing a charge. In a preferred embodiment of the present invention, the floating gate has a gate length that is less than 0.5 microns. In a more preferred embodiment, the floating gate has a gate length that is between about 0.18 and about 0.35 microns.

On top of semiconductor substrate 101 is formed conductive layer 102. In the embodiment of the present invention shown in FIG. 1, conductive layer 102 forms the final metal interconnect for the flash memory. Conductive layer 102 may comprise any metal conventionally used to make metal interconnects for flash memories, including, for example, copper, a copper alloy, aluminum or an aluminum alloy, such as an aluminum/copper alloy.

Conductive layer 102 may include a number of separate layers. For example, conductive layer 102 may comprise a primary conductor made from an aluminum/copper alloy (preferably comprising less than about 1% copper) that is sandwiched between a relatively thin titanium layer located below it and a relatively thin titanium nitride layer located above it. The titanium nitride upper layer may itself be formed between two thin titanium layers—the three layers stacked on top of the aluminum/copper primary conductor. Alternatively, conductive layer 102 may comprise a copper layer formed on an underlying barrier layer.

Although a few examples of the types of materials that may form conductive layer 102 have been identified here, conductive layer 102 may be formed from various other materials that can serve to conduct electricity within a flash memory. In the embodiment shown in FIG. 1, conductive layer 102 comprises metal layer 110, preferably an aluminum/copper alloy, formed between barrier layers 111 and 112, preferably comprising titanium and titanium nitride, respectively. (Although not shown in FIG. 1, if titanium nitride layer 112 is formed using a sputtering process, a subsequent sputter clean step may produce a very thin layer of titanium on top of titanium nitride layer 112.)

On top of conductive layer 102 is formed UV opaque passivation layer 103. As shown in FIG. 1, passivation layer 103 preferably comprises barrier layer 104, which is formed on top of conductive layer 102, and stress reduction layer 105, which is formed on top of barrier layer 104. Barrier layer 104 preferably comprises silicon nitride and stress reduction layer 105 preferably comprises a polyimide. FIG. 1 represents the state of the device after passivation layer 103 has been etched to define the device's bond pads.

Figure 2:
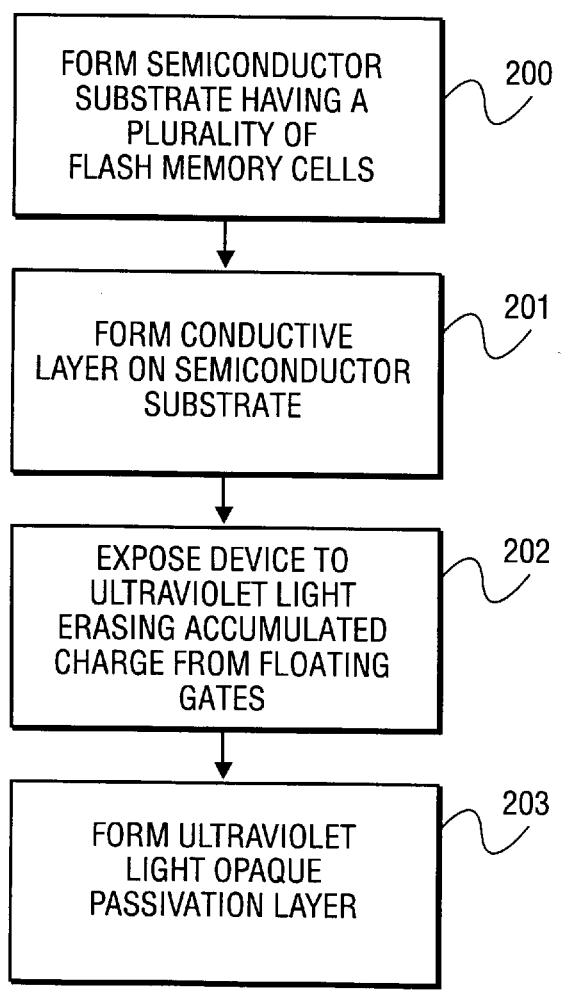
FIG. 2 is a flow chart illustrating steps that may be used to form a flash memory that includes a passivation layer made from UV opaque materials.

FIG. 2 is a flow chart for a process that may be used to make the flash memory represented by FIG. 1. In step 200, a semiconductor substrate that includes a plurality of flash memory cells, each having a floating gate, is formed. Such a structure may be made from materials normally used to make flash memories using conventional process steps, as is well understood by those skilled in the art. Such process steps include certain plasma etch and deposition steps that may charge the floating gates of the flash memory cells. As mentioned above, the gate length for the floating gate preferably is less than about 0.5 microns.

In step 201, a conductive layer is formed on the semiconductor substrate using conventional materials and process steps. Next, at step 202, the device is exposed to UV light to erase any charge that has accumulated on the floating gates. That UV erase step preferably takes place after all charge inducing process steps have been completed, e.g., after the final metal interconnect for the flash memory has been formed.

A deep ultraviolet ("DUV") photostabilizer, such as is conventionally used to harden, i.e., cure, photoresist prior to etching or ion implantation steps, may be used to perform that UV erase step. The same equipment used to harden or cure photoresist earlier in the process, e.g., a photostabilizer available from Fusion Semiconductor, may be used to effect the UV erase step. Depending upon the particular process used to make the flash memory, that UV erase step may call for exposing the device at an intensity of about 240 mW/cm$^2$ for as little as 115 seconds up to about 10 minutes or more.

At step 203, a UV opaque passivation layer is formed. Preferably, that layer is formed by first depositing a barrier layer and then a stress reduction layer. The preferred material for forming the barrier layer is silicon nitride and the preferred material for forming the stress reduction layer is polyimide. When formed from silicon nitride, the barrier layer preferably is between about 2,000 and about 10,000 angstroms thick (more preferably about 7,500 angstroms thick)—and is deposited using, for example, a conventional PECVD process. Silane and ammonia may serve as the silicon and nitrogen sources used in such a process, which may take place at a temperature of between about 350 and 450° C. A short $N_2O$ plasma may be applied at the end of that process step to oxidize the surface of the silicon nitride, which should help prevent polyimide lifting.

Although barrier layer 104 preferably is made from silicon nitride, barrier layer 104 may be formed from other materials. For example, barrier layer 104 may comprise a double layer having a silicon nitride layer formed on a silicon dioxide layer. In that embodiment of the present invention, the silicon nitride layer preferably is between about 2,000 and 5,000 angstroms (more preferably about 3,000 angstroms) thick and the silicon dioxide layer preferably is between about 2,000 and 10,000 angstroms (more preferably between about 5,000 and 8,000 angstroms) thick. In that embodiment, the silicon dioxide layer is preferably deposited using a PECVD process that employs TEOS as the silicon source, which should generate a layer having better conformity than would result from using a silicon nitride layer to fill gaps within the metal interconnect.

In still another embodiment, barrier layer 104 may comprise silicon oxynitride either alone or combined with a separate silicon dioxide or silicon nitride layer. After forming the barrier layer, a polyimide layer may be deposited upon the surface of that layer. Preferably, the polyimide layer is spun onto the silicon nitride layer, then cured.

The barrier layer, e.g., the layer comprising silicon nitride, protects the device from damage that may occur during subsequent process steps, and also serves as a barrier against moisture and sodium ions, which could adversely affect the device's reliability. The stress reduction layer, e.g., the polyimide layer, provides stress relief, which helps prevent the barrier layer from cracking or breaking during the chip assembly process. After the passivation layer is formed, it is etched to define bond pads, which will be used to connect the device to the chip package, as will be apparent to those skilled in the art. After that etch step, conventional processing follows to complete the device.

Applying the UV erase step before forming the passivation layer, permits forming that layer from UV opaque materials, which may produce a higher quality passivation layer. Features shown in the above referenced drawings are not intended to be drawn to scale, nor are they intended to be shown in precise positional relationship. In addition, process steps that may be used to make the embodiments described above have been omitted when not useful to describe aspects of the present invention.

Although the foregoing description has specified a method for making a flash memory that includes certain process steps, and has specified certain materials that may be used to make such a device, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for making a flash memory comprising:
   forming a semiconductor substrate that includes a flash memory cell that has a floating gate;
   forming a conductive layer on the substrate; then
   neutralizing process induced charge that has accumulated on the flash memory cell's floating gate by exposing the substrate to ultraviolet light; and then
   forming on the conductive layer a passivation layer that comprises a barrier layer that comprises a silicon nitride layer and a stress reduction layer that comprises a polyimide layer.

2. The method of claim 1 wherein the flash memory cell's floating gate has a gate length that is less than about 0.5 microns.

3. The method of claim 2 wherein the flash memory includes a final metal interconnect and wherein the conductive layer forms the final metal interconnect for the flash memory, upon which is formed the passivation layer.

4. A method for making a flash memory that includes a final metal interconnect comprising:
   forming a semiconductor substrate that includes a flash memory cell that has a floating gate that has a gate length that is less than about 0.5 microns;
   forming a conductive layer on the substrate that forms the final metal interconnect for the flash memory; then
   exposing the flash memory cell's floating gate to ultraviolet light; and then
   forming on the conductive layer a passivation layer that comprises a silicon nitride layer and a polyimide layer.

\* \* \* \* \*